United States Patent [19]

Gebo

[11] 3,883,715

[45] May 13, 1975

[54] CONTROLLED ENVIRONMENT MODULE

[75] Inventor: Charles Henry Gebo, Rochester, N.Y.

[73] Assignee: Sybron Corporation, Rochester, N.Y.

[22] Filed: Dec. 3, 1973

[21] Appl. No.: 421,137

[52] U.S. Cl. .................... 219/210; 331/67; 331/68

[51] Int. Cl. .................... H05b 1/00

[58] Field of Search .................... 219/209, 210, 510; 331/67-70; 310/8.9

[56] References Cited

UNITED STATES PATENTS

| | | | |
|---|---|---|---|
| 1,937,583 | 12/1933 | Norman | 331/69 X |
| 3,041,549 | 6/1962 | Keen et al. | 331/69 |
| 3,244,371 | 4/1966 | Bishop | 219/210 X |
| 3,252,109 | 5/1966 | White | 331/69 |
| 3,264,448 | 8/1966 | Lehmer | 219/210 |

*Primary Examiner*—C. L. Albritton
*Attorney, Agent, or Firm*—Theodore B. Roessel; Charles C. Krawczyk; J. Stephen Yeo

[57] ABSTRACT

A plug in module for providing a temperature contolled environment and a electromagnetic shield for electronic circuits contained therein. The electronic circuit is mounted within a metallic enclosure so that a low impedance path for thermal conduction is provided to heater and a temperature sensor mounted on the exterior of metallic enclosure. Coaxial connections are provided so that the metallic enclosure functions as an electromagnetic shield. A thermally insulating housing encloses the metallic shell, the heater, the the temperature sensor, and other electronic circuit components that require temperature regulation. An electrical connector provides "plug-in" connections to the circuit elements within the module.

10 Claims, 9 Drawing Figures

CONTROLLED ENVIRONMENT MODULE

BACKGROUND OF THE INVENTION

This invention pertains to enclosures for electronic circuits in general, and more particularly to enclosures for providing a substantially constant temperature and electromagnetic shielding.

Very often, low level, high gain electronic instruments are required to be located in areas which present severe environmental conditions, such as changing temperatures and high frequency electromagnetic radiation. For example, sensitive electronic circuits are used in industrial plants experiencing wide fluctuations in operating temperatures, and wherein "walkie-talkie" type systems are used for communications. Such environmental conditions are particularly troublesome when the electronic circuit include a high gain DC amplifier, of the type used with thermocouple measuring equipment.

The temperature changes in such locations are such that, without any control over the environment of the electronic circuit, the temperature sensitive components may vary to the extent that intolerable errors are introduced into the circuit output signals. Electronic components, such as resistors, diodes etc., are not available with sufficiently low temperature coefficients for use with such sensitive electronic circuits unless they are also operated in a temperature controlled environment. The temperature effects on electronic circuits, such as high gain DC amplifiers, can be controlled to a large degree by the use of exotic temperature compensating circuitry including modulation and demodulation techniques. Although this type of arrangement does provide a stable arrangement, the circuit is generally quite expensive, and is still subject to electromagnetic radiation.

Operational amplifiers, for example, will respond to electromagnetic radiation anywhere from the low megahertz range to several hundred megahertz, even though the specified useful range for such amplifiers is stated to be less than 30 kilohertz. In the case of such high frequency electromagnetic radiation, the pick-up of the leads extending to the DC amplifiers may introduce sufficient noise to render the circuit ineffective or even saturated.

Various schemes have been employed in the prior art for maintaining electronic devices witihin a controlled environment. A controlled environment module is discloseed in a U.S. Pat. No. 2,967,924, entitled "Stable Temperature Reference for Instrument Use," issued to C. K. Friend, on Jan. 10, 1961. Although the controlled environmental module disclosed in the patent solved problems concerned with temperature control, the arrangement disclosed does not provide the required degree of protection for isolating high gain electronic circuitry from electromagnetic radiation.

It is therefore, an object of this invention to provide a new and improved controlled environment module for electronic circuits for providing a combination of constant temperature control and an electromagnetic shielding.

It is also an object of this invention to provide a new and improved low cost temperature controlled and electromagnetic radiation free environmental module for temperature and radiation sensitive electronic circuits.

It is still a further object of this invention to provide a new and improved controlled environment module for temperature and electromagnetic radiation sensitive electronic circuits including means for providing a controlled temperature environment for thermocouple cold junctions and/or other temperature sensitive circuit components.

BRIEF DESCRIPTION OF THE INVENTION

A controlled environment module for temperature and electromagnetic radiation sensitive electronic circuits. Electronic circuits are adapted to be mounted within an electrically conductive metallic enclosure, with coaxial electrical connections extending through the enclosure to the electronic circuits to form an electromagnetic shield. A heater and a temperature sensor are mounted on the exterior of the enclosure in a manner so that a low impedance path for thermal conduction is provided between the electronic circuits and the temperature sensor and the heater. The metallic enclosure, the heater, and the temperature sensor are all enclosed within a thermally insulating housing. Circuit means in the form of a connector are provided for making electrical connections to the circuit within the controlled environment module.

In accordance with a feature of the invention, the electronic circuits are mounted onto a heat sink which is secured to the same wall of the metallic enclosure as that to which the heater and the temperature sensor are mounted so that the heat sink, the temperature sensor, and the heater are all interconnected by a low impedance path for thermal conduction.

In accordance with another feature of the invention, means are provided for receiving additional electronic circuits, to be connected to the electronic circuits, within the housing and in close proximity to the heater and temperature sensor to provide a controlled temperature environment for the additional electronic circuits.

In accordance with another feature of the invention, when the controlled environment module is used to include electronic circuits for monitoring thermocouple outputs, the cold junctions for the thermocouple wire are made within the thermally insulating shell thereby providing a controlled temperature environment for the cold junctions.

DETAILED DESCRIPTION

Figure 1:
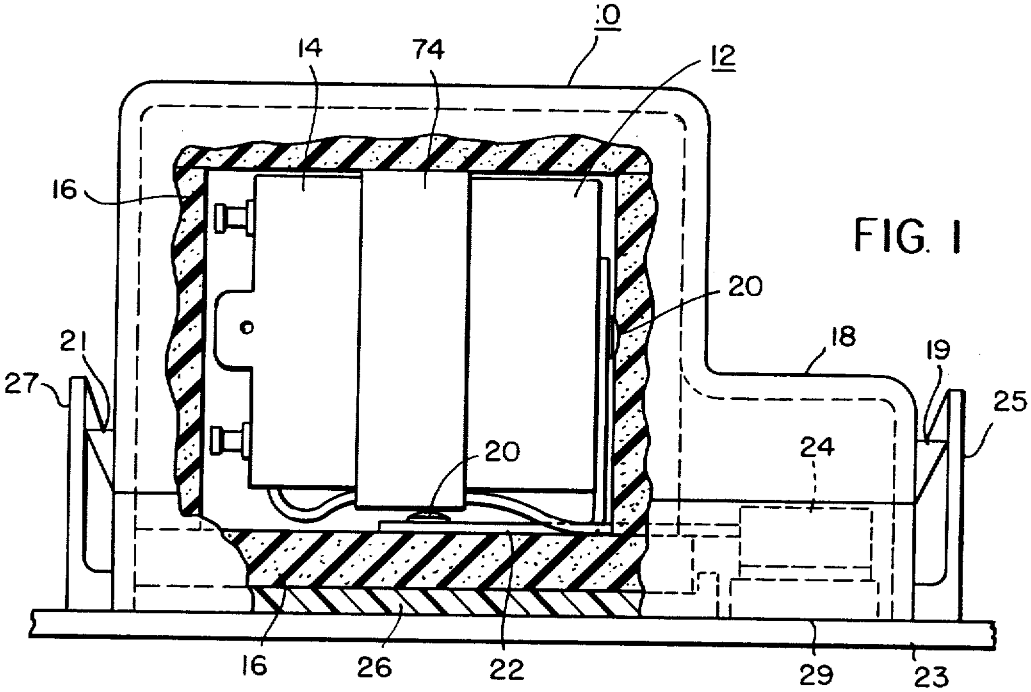
FIG. 1 is a side view of a controlled environment module including the invention having its thermally insulating housing cut away to disclose the inner metallic enclosure and illustrating an electrical connector (in phantom) for making connections to the electronic circuits within the module.
Figure 2:
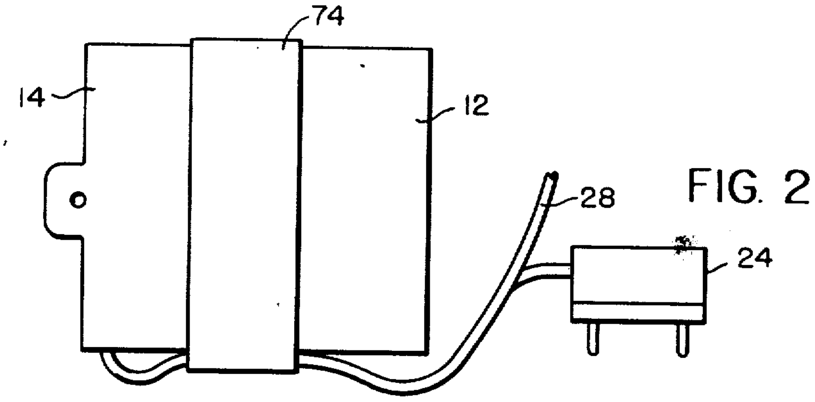
FIG. 2 is a side view of the metallic enclosure of FIG. 1 illustrating the thermocouple wire inputs and the electrical connections to the connector.
Figure 3:
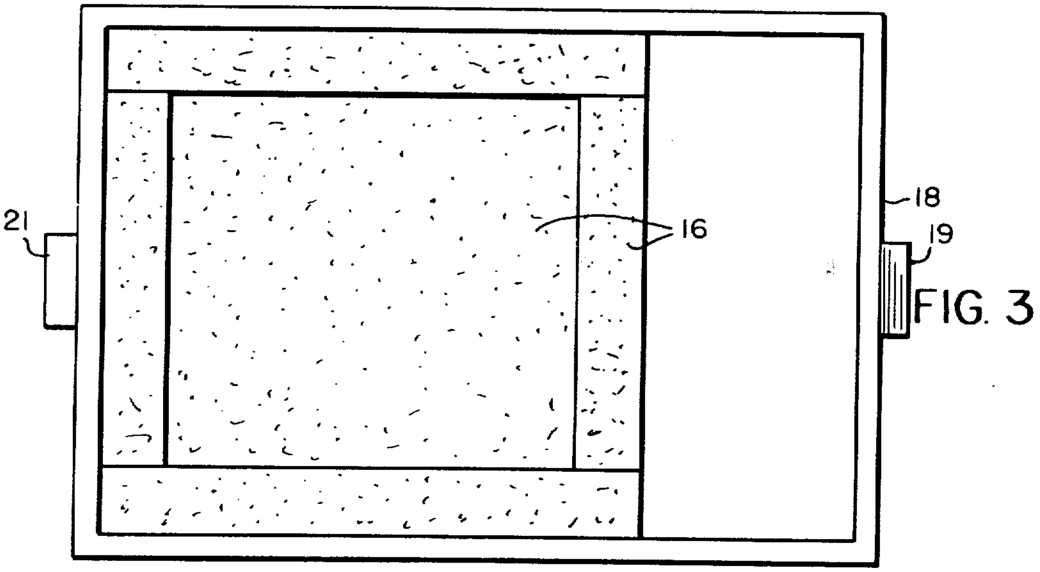
FIG. 3 is a bottom view of the thermally insulating housing of FIG. 1 with the base plate removed.
Figure 4:
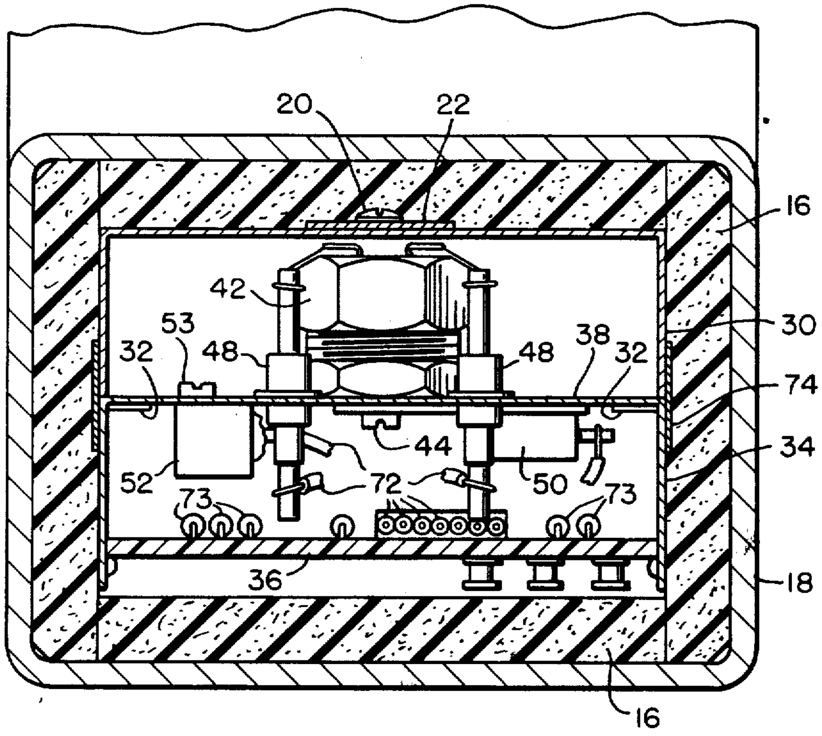
FIG. 4 is sectional view of a portion of the module of FIG. 1.
Figure 5:
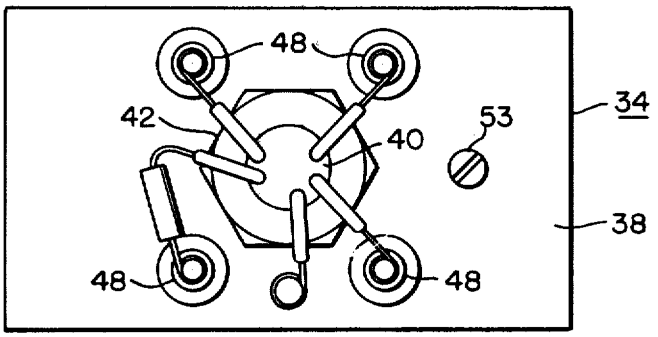
FIG. 5 is a top view of a portion of the metallic enclosure illustrating the mounting of the heat sink and the electronic circuits included there.
Figure 6:
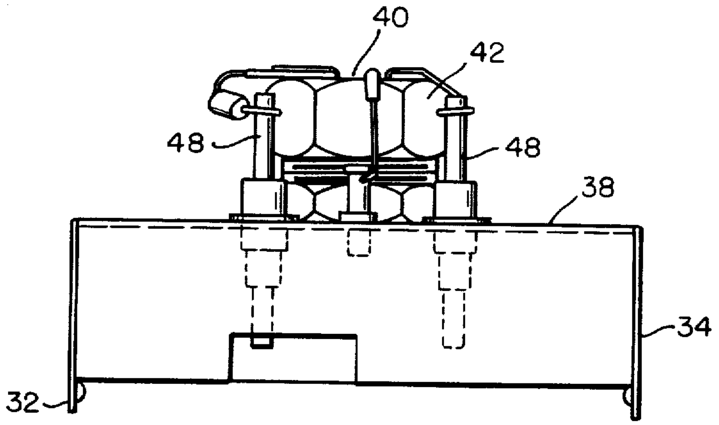
FIG. 6 is a side view of FIG. 5.
Figure 7:
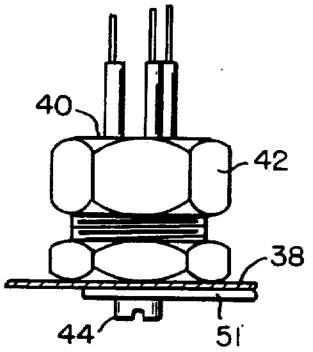
FIG. 7 is an enlarged side view of the heat sink and an electronic circuit of FIG. 5.

The module of the invention provides a combined controlled temperature and electromagnetic radiation free environment for temperature and electromagnetic radiation sensitive electronic circuits, and a temperature controlled environment and partial electromagnetic shielding for electrical circuits that are less sensitive to electromagnetic radiation but still require temperature control. As illustrated in FIG. 1, the module 10 includes a first, or inner metallic enclosure 12 in which temperature and radiation sensitive electronic circuits are mounted. The metallic enclosure 12 provides an electromagnetic shield for the electronic circuits contained therein and in addition provides a low impedance path for thermal conduction (i.e., tight thermalcoupling) between a heater chamber 14 and the electronic circuits within the enclosure 12. As will be described later, the heater chamber 14 includes means for controlling the temperature of the module, means for receiving cold junctions of thermocouples, and means for receiving temperature sensitive electronic circuits that are not as sensitive to electromagnetic radiation as those within the enclosure 12. The metallic enclosure 12 and the heater chamber 14 are surrounded by a housing 18. The housing 18 includes a rigid exterior shell 18 that provides a thermal insulating function and includes insulating material 16, as polyurethane foam. The metallic enclosure 12 is mounted to the housing 18 via screws 20 and a bracket 22 that extends through the insulation 16 and is secured to the detachable base 26 of the housing 18. Electrical connections to the components within the heating chamber 14 and the metallic enclosure 12 are made via a connector 24 so that the arrangement comprises a "plug-in" type controlled environment module. When the module 10 is to be used as a thermocouple sensing circuit, the thermocouple wires 28 are brought in separate from the connector 24, as illustrated in FIG. 2.

The housing 18 can be formed of a thermally insulating material, plastic, or if further electromagnetic shielding is desired, metal. The housing 18 includes a pair of tabs 19 and 21 on opposite ends thereof. The tabs 19 aand 21 are used for mounting the module 10 to a printed circuit board 23 via the resilient clips 25 and 27. The connector 24 is inserted into an appropriate receptical 29 also mountd on the printed circuit board 23. The thermocouple wire 28 can extend through an appropriate opening through the housing 18.

Referring now to FIGS. 4–9, the metallic enclosure 12 includes a first rectangular shaped metallic box 30 having one side thereof open and including a plurality of tabs 32 for securing the first box 30 to a second metallic box 34. The box 34 includes an open side, onto which a printed circuit board 36 is secured. The combination of the box 30 and the side 38 of the box 34, along with a coaxial coupling means, (discussed in greater detail in later part in specification) form the electromagnetic shield for receiving temperature and radiation sensitive electronic circuits. The combination box 34 and the printed circuit board 36 from the heater chamber 14 for receiving those circuit components that are less radiation sensitive but require temperature control.

Electronic circuits 40, such for example the high gain direct current amplifier, is mounted within a heat sink 42 to provide a thermal lag and heat exchange arrangement for the electronic circuits. The heat sink 42 is secured to the wall 38 of the box 34 by a screw 44 so that when the boxes 30 and 34 are assembled, the heat sink 42 and electronic circuits 42 extend within the box 30. The heat sink 42 is secured to the wall 38 by a screw 44 in a manner to provide a low impedance path for thermal conduction (ie. tight thermal coupling) between a wall 38 and the heat sink 42. The input and output terminals of the electronic circuits 40 are connected to separate ones of a plurality of coaxial means 48, such as feedthrough capacitor connectors. The feed through capacitor connectors 48 are standard components providing a direct current connection therethrough while providing capacitive coupling to the wall 38. The combination of the metallic enclosure (boxes 30 and 34) along with connections thereto being made by the feed through capacitor connectors 48 provides an excellent means for isolating the electronic circuit 40 from any external electromagnetic radiation. The isolation is further enhanced by a metallic tape 74 wrapped around the junction of the boxes 30 and 34.

As previously mentioned, the area enclosed within the box 34 and the printed circuit board 36 define the heating chamber 14. The heating chamber 14 includes a heater 50 secured to the wall 38 through an electricity insulating but thermally conductive compound 51 so that it in response to energization the heater 50 applies heat thereto. In addition, a combined temperature sensor and cold junction module 52 is secured to the wall 38 in a manner to provide a low impedance path for thermal conduction between the wall 38 and the temperature sensor and cold junctions contained therein.

Figure 8:
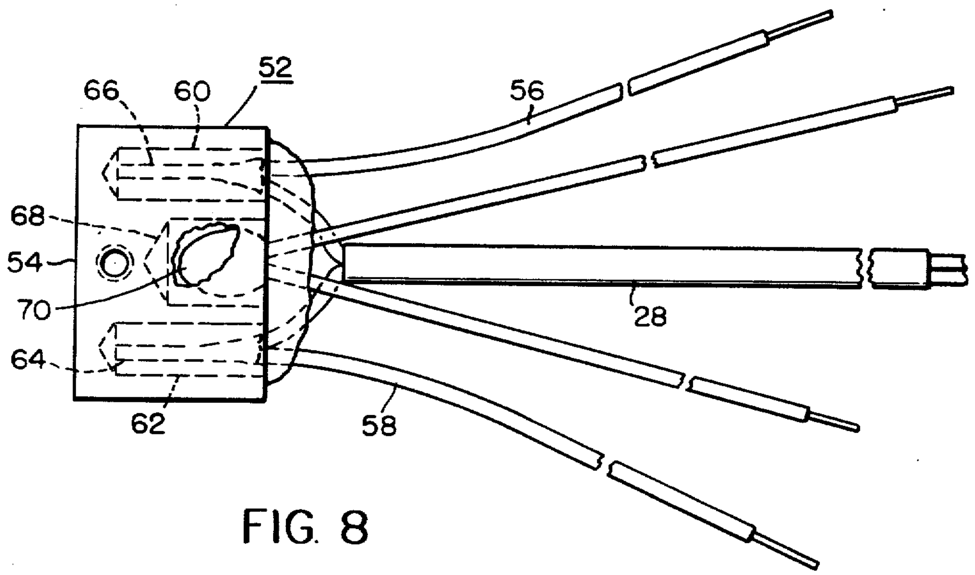
FIG. 8 illustrates a heat sink module for mounting a temperature sensor and the cold junctions of thermocouple wires to a wall of the inner metallic shell.

FIG. 8 is an enlarged view of the combined temperature sensor and cold junction module 52. The module 52 includes a metallic heat sink 54. The thermocouple wires 28 and extend into the cavities 60 and 62 and make electrical connections with the copper wires 56 and 58 to define a pair of cold junctions 64 and 66. The cold junctions are wrapped with insulating material to prevent an electrical connection to the heat sink 54. An additional cavity 68 is formed within the heat sink 54 for receiving a temperature sensor 70. The temperature sensor is also electrically insulated from the heat sink 54. The cold junctions 64 and 66 and the temperature sensor 70 are sealed within the heat sink 54 by some appropriate filler material.

Figure 9:
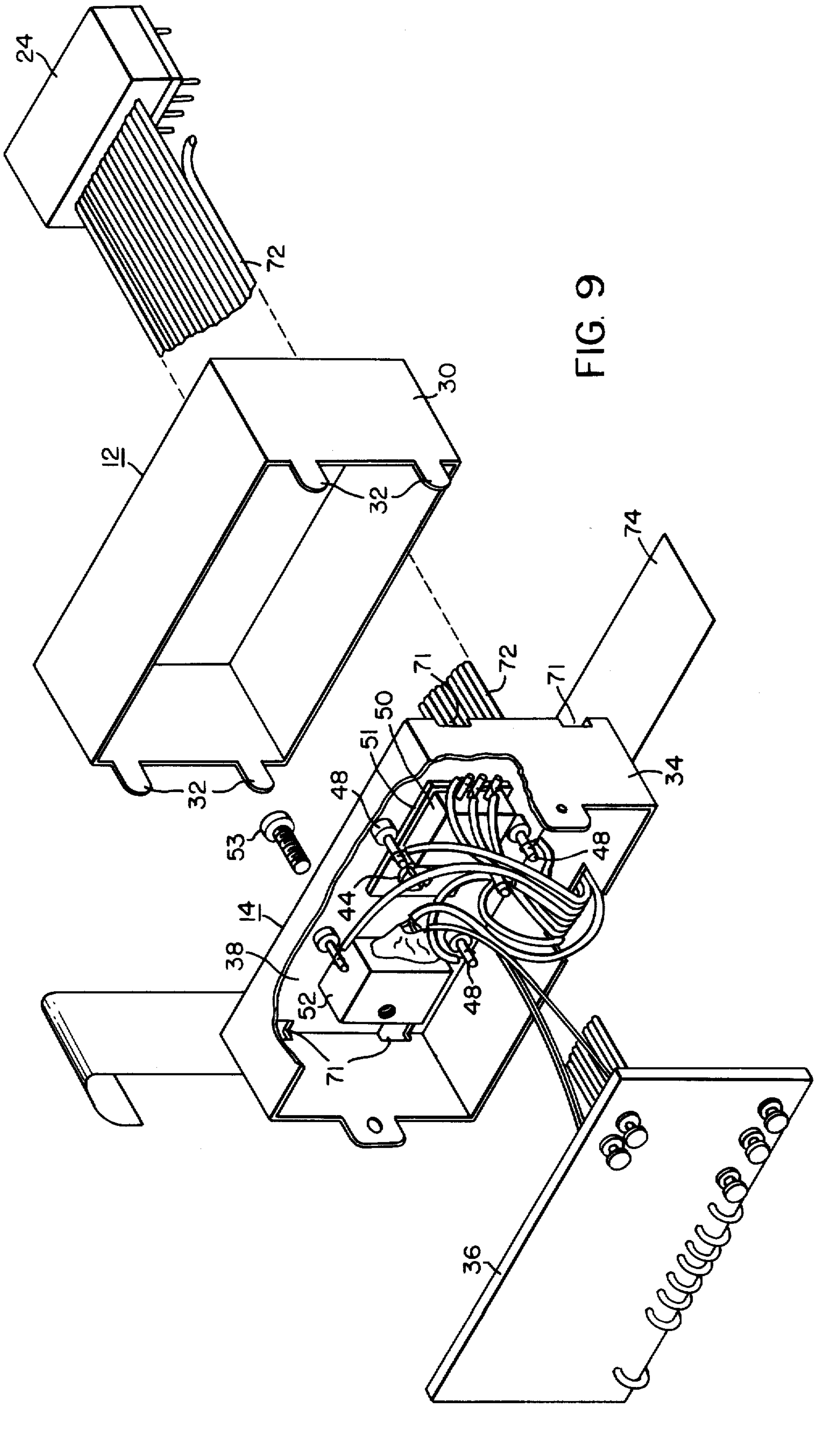
FIG. 9 is an exploded view of the metallic enclosure showing the assembly thereof.

As illustrated in FIG. 9, the electromagnetic shield is assembled by positioning the open side of the box 30 over the wall 38 so that the tabs 32 fit into the openings 71 provided for mating the two boxes. The tabs 32 are folded over to secure the units together. The circuit board 36 with various temperature sensitive electronic components (but less sensitive to radiation than the elctronic circuit 40) mounted thereon, is positioned over the open side of the box 34 to enclose the heater chamber 14. The electrical connections between the circuit board 36 and the components within the box 34 are made before the printed circuit board is secured into position. The metallic box 34 provides a limited degree of electromagnetic shielding for the electronic circuits within the heater chamber 14. The electrical connections from the circuit board 36 and from the components within the box 34 are made by a ribbon cable 72 to the connector 24. The adhesive backed copper tape 74 is wraped around the junction of the boxes 30 and 34, including the cable 72, to complete the electromagnetic shield by preventing radiation leakage between the junction of the boxes 30 and 34. The tape 74 also aids in thermally sealing the junction. This completes the assembly of the combined electromagnetic shield and heater chamber. This unit is now placed within the thermally insulating housing 18 and mounted via the bracket 22 to the base 26.

The module of the invention provides means by which sensitive electronic circuits are fully isolated from any electrical magnetic radiation while simulataneously therewith maintaining the electronic circuitry in an controlled temperature environment. The module of the invention also provides additional means for providing a temperature controlled environment and partial shielding for electronic circuits that are less sensitive to radiation but still need temperature control. It was found that the cost of producing the controlled environment module of the invention wherein both temperature controlled and radiation controlled environments were provided was less than the cost of the exotic temperature controlled electronic circuits by themselves. The combination of the metallic enclosure 12 along with the feed-through capacitor connectors 48 provides a radiation free environment for the electronic circuit contained therein. By mounting the electronic circuit 40 and its heat sink 42 to the same wall 38 to which the heater and the temperature sensor are attached, a very low impedance path for thermal conduction is established between the wall 38 and each of these items, so that the temperature thereof can be acurrately controlled. Circuit means are provided for making connections to the temperature sensor 70 and the heater 50 for providing the control circuitry for maintaining the temperature of the wall 38 substantially constant. The module of the invention also provides for a temperature controlled environment for other temperature sensitive parts of the overall electronic circuit contained therein, such as wire wound resistors abd reference zener diodes, as well as thermocouple cold junctions.

In operation, the internal controlled temperature of the module is selected to be greater than the highest temperature that the external environment is expected to reach. As a result, the heater will supply the amount of heat needed to maintain the module at the selected temperature and the cooling of the module will not be needed. For example, an operating temperature of 65° C. can be selected, which is 5°C higher than the maximum expected normal ambient temperature and therefore always requiring heat input to maintain the module at the preselected temperature.

What is claimed is:

1. A controlled environment module for electronic circuits comprising:

an electrically conductive metallic enclosure;

means for mounting electronic circuits within said metallic enclosure to provide a low impedance path for thermal conduction between the enclosure and the electronic circuits;

coaxial electromagnetic radiation isolating feedthrough means extending through said metallic enclosure for providing electrical connections to the electronic circuits within said metallic enclosure, wherein said metallic enclosure and said coaxial electromagnetic radiation isolating feedthrough means provide an electromagnetic shield for the electronic circuits;

heater means mounted on the exterior of said metallic enclosure for applying heat thereto when energized;

temperature sensing means mounted on the exterior of said metallic enclosure with a low impedance path for thermal conduction between said temperature sensing means and said metallic enclosure;

a thermally insulating housing enclosing said metallic enclosure, said heater means, and said temperature sensing means; and circuit means extending through said housing for providing connections to said coaxial electromagnetic radiation isolating feedthrough means, said heater means and said temperature sensing means.

2. A control environment module as defined in claim 1 wherein said mounting means includes:

a heat sink for receiving said electrical circuits therein, mounted within said metallic enclosure and fastening means extending through said metallic enclosure for securing said heat sink to said metallic enclosure to provide the low impedance thermal path.

3. A controlled environment module as defined in claim 2 wherein:

said coaxial means includes feed-through capacitor connectors secured to electromagnetic radiation isolating feedthrough said metallic enclosure and extending therethrough.

4. A controlled environment module as defined in claim 3 wherein:

metallic means extend from said metallic enclosure that defines a temperature controlled cavity for said heater and temperature sensor and for additional electronic circuit mounted therein.

5. A controlled environment module as defined in claim 4 wherein:

the electronic circuits comprise a solid state high gain amplifier.

6. A controlled environment module as defined in claim 5 wherein:

said amplifier is a direct current amplifier for use in amplifying thermocouples signals, and circuit means are included for receiving the thermocouple wires within said temperature controlled cavity and providing connections to electrical circuits therein, wherein the module provides a temperature controlled environment for the cold junction connections to the thermocouple wires.

7. A controlled environment module as defined in claim 6 wherein:

said circuit means for said thermocouple wire includes a heat sink for receiving the connections to the thermocouple wires for providing a low impedance path for thermal conduction between said metallic enclosure and said cold junction connections.

8. A controlled environment module as defined in claim 3 wherein said metallic enclosure includes:

a metallic housing, one side of which is open;

a metallic cover for the open side of said metallic housing wherein said heat sink and electronic circuits contained therein are mounted on one side of said metallic cover, said heater and said temperature sensor are mounted on the other side of said cover, and said feed-through capacitor connector extend through the cover and means for securing said cover to said metallic housing so that the heat sink and electronic circuit extend within the metallic housing, wherein the combination of the metallic housing, cover and the feed-through capacitor connectors form an electromagnetic shield.

9. A controlled environment module as defined in claim 8 wherein:

said cover is in the form of a second metallic housing having one side open, wherein one side of said second metallic housing corresponds to the cover for said other metallic housing for closing thereof; and a means mounted adjacent said open side of said second metallic housing to enclose the second metallic housing, to provide electrical connections thereto, and for mounting additional temperature sensitive circuits within the cavity defined by said second metallic housing.

10. A controlled environment module as defined in claim 9 wherein:

connector means is mounted on said thermally insulating housing to provide a plug-in type connections to the circuit therein.

* * * * *